United States Patent [19]
Albin et al.

[11] Patent Number: 5,436,204
[45] Date of Patent: Jul. 25, 1995

[54] RECRYSTALLIZATION METHOD TO SELENIZATION OF THIN-FILM CU(IN,GA)SE$_2$ FOR SEMICONDUCTOR DEVICE APPLICATIONS

[75] Inventors: David S. Albin, Denver; Jeffrey J. Carapella, Evergreen; John R. Tuttle, Denver; Miguel A. Contreras, Golden; Andrew M. Gabor, Boulder; Rommel Noufi, Golden; Andrew L. Tennant, Denver, all of Colo.

[73] Assignee: Midwest Research Institute, Kansas City, Mo.

[21] Appl. No.: 293,826

[22] Filed: Aug. 22, 1994

Related U.S. Application Data

[63] Continuation-in-part of Ser. No. 45,860, Apr. 12, 1993, Pat. No. 5,356,839.

[51] Int. Cl.$^6$ ................................. H01L 21/302
[52] U.S. Cl. ................................. 437/225; 437/5; 437/247; 136/258; 136/260; 136/265
[58] Field of Search ............ 437/225, 5, 247, 103, 437/106, 234; 136/260, 265, 258, 264

[56] References Cited

U.S. PATENT DOCUMENTS

| | | | |
|---|---|---|---|
| 4,335,266 | 6/1982 | Mickelsen et al. | 136/260 |
| 4,465,575 | 8/1984 | Love et al. | 136/260 |
| 4,581,108 | 4/1986 | Kapus et al. | 136/260 |
| 4,652,332 | 3/1987 | Ciszek | 156/607 |
| 4,687,881 | 8/1987 | Goslowsky et al. | 136/255 |
| 4,703,131 | 10/1987 | Dursch | 136/258 |
| 4,798,660 | 1/1989 | Ermer et al. | 204/192.17 |
| 4,818,357 | 4/1989 | Case et al. | 204/192.25 |
| 4,909,863 | 3/1990 | Birkmire et al. | 148/33.4 |
| 4,915,745 | 4/1990 | Pollock et al. | 136/260 |
| 4,940,604 | 7/1990 | Suyama et al. | 136/264 |
| 5,028,274 | 7/1991 | Basol et al. | 136/264 |
| 5,045,409 | 9/1991 | Eberspacher et al. | 136/264 |
| 5,078,804 | 1/1992 | Chen et al. | 437/5 |
| 5,141,564 | 8/1992 | Chen et al. | 136/258 |

FOREIGN PATENT DOCUMENTS

0318315A2 5/1989 European Pat. Off. .
0360403A2 3/1990 European Pat. Off. .

OTHER PUBLICATIONS

"Fundamental Thermodynamics and Experiments in Fabricating High Efficiency CuInSe$_2$ Solar Cells by Selenization Without the Use of H$_2$Se," D. Albin, et al., AIP Conference Proceedings 268, Denver, Colo., 1992, p. 108.

(List continued on next page.)

*Primary Examiner*—Tom Thomas
*Assistant Examiner*—Tuan Nguyen
*Attorney, Agent, or Firm*—Edna M. O'Connor

[57] ABSTRACT

A process for fabricating slightly Cu-poor thin-films of Cu(In,Ga)Se$_2$ on a substrate for semiconductor device applications includes the steps of forming initially a slightly Cu-rich, phase separated, mixture of Cu(In,Ga)Se$_2$:Cu$_x$Se on the substrate in solid form followed by exposure of the Cu(In,Ga)Se$_2$:Cu$_x$Se solid mixture to an overpressure of Se vapor and (In,Ga) vapor for deposition on the Cu(In,Ga)Se$_2$:Cu$_x$Se solid mixture while simultaneously increasing the temperature of the solid mixture toward a recrystallization temperature (about 550° C.) at which Cu(In,Ga)Se$_2$ is solid and Cu$_x$Se is liquid. The (In,Ga) flux is terminated while the Se overpressure flux and the recrystallization temperature are maintained to recrystallize the Cu$_x$Se with the (In, Ga) that was deposited during the temperature transition and with the Se vapor to form the thin-film of slightly Cu-poor Cu$_x$(In,Ga)$_y$Se$_z$. The initial Cu-rich, phase separated large grain mixture of Cu(In,Ga)Se$_2$:Cu$_x$Se can be made by sequentially depositing or co-depositing the metal precursors, Cu and (In, Ga), on the substrate at room temperature, ramping up the thin-film temperature in the presence of Se overpressure to a moderate anneal temperature (about 450° C.) and holding that temperature and the Se overpressure for an annealing period. A nonselenizing, low temperature anneal at about 100° C. can also be used to homogenize the precursors on the substrates before the selenizing, moderate temperature anneal.

26 Claims, 7 Drawing Sheets

OTHER PUBLICATIONS

T. L. Chu et al., "Large Grain Copper Indium Diselenide Films", J. Electrochemical Soc. 13 (9), p. 2182 (1984).

H. Dittrick et al., "Structural Characterization of Chalcopyrite Thin Films Grown by Selenization" from *Ternary and Multinary Compounds—Proceedings of the 7th International Conference*, Edited by S. K. Deb and A. Zunger, p. 161 (1987).

Jozef Szot et al., "Selenization of metallic Cu–In thin films for CuInSe$_2$ solar cells", J. Appl. Phys. 66 (12), p. 6077 (1989).

J. Kessler et al., "Low Pressure Vapor Selenization of Cu–In Films Without H$_2$Se", presented at the 10th European Photovolatic Solar Energy Conference and Exhibition, Lisboa, (1991).

B. Dimmler et al., "Properties of Cu(In.Ga)Se$_2$ Thin Film Surfaces and Their Relation to Device Performance", from the 6th International Photovolatic Science and Engineering Conference Proceedings, New Dehli, India, Feb. 10–14, p. 103 (1992).

A. E. Delahoy et al., "A New Self-Stabilizing Selenization Process for the formation of CuInSe$_2$ Solar Cells", in AIP Conference Proceedings 268 Photovolatic Advanced Research & Development Project, Denver Colo. 1992, edited by Rommel Noufi, p. 170 (1992).

RECRYSTALLIZATION METHOD TO SELENIZATION OF THIN-FILM CU(IN,GA)SE$_2$ FOR SEMICONDUCTOR DEVICE APPLICATIONS

CONTRACTUAL ORIGIN OF THE INVENTION

This United States Government has rights in this invention under Contract No. DE-AC3683CH10093 between the U.S. Department of Energy and the National Renewable Energy Laboratory, a Division of Midwest Research Institute. This application is a continuation-in-part of Ser. No. 08/045,860, filed on Apr. 12, 1993, now U.S. Pat. No. 5,359, entitled "Enhanced Quality Thin Film Cu(In,Ga)Se$_2$ for Semiconductor Device Applications by Vapor-Phase Recrystallization."

BACKGROUND OF THE INVENTION

1. Field of the Invention

The present invention is related generally to preparation of thin-film compounds and more particularly to preparing thin-film compounds of Cu(In,Ga)(Se,S)$_2$ in semiconductor devices.

2. Description of the Prior Art

Thin-films of copper-indium-diselenide (CuInSe$_2$), copper-gallium-diselenide (CuGaSe$_2$), and copper-indium-gallium-diselenide (CuIn$_{1-x}$Ga$_x$Se$_2$), all of which are sometimes generically referred to as Cu(In,Ga)Se$_2$, have become the subject of considerable interest and study for semiconductor devices in recent years. Sulphur can also be, and sometimes is, substituted for selenium, so the compound is sometimes also referred to even more generically as Cu(In,Ga)(Se,S)$_2$ to comprise all of those possible combinations. They are of particular interest for photovoltaic device or solar cell absorber applications because of solar energy to electrical energy conversion efficiencies that have been shown to exceed seventeen percent (17%) in active areas and to approach seventeen percent (17%) in total areas, which is quite high for current state-of-the-art solar cell technologies. It has been generally believed by persons skilled in this art that the best electronic device properties, thus the best conversion efficiencies, are obtained when the mole percent of copper is about equal to the mole percent of the indium, the gallium, or the combination of the indium and gallium in the Cu(In,Ga)Se$_2$ compound or alloy. The selenium content will not generally be important to the electronic properties of the semiconductor if the growth conditions supply sufficient selenium so that it comprises about fifty atomic percent (50 at. %) of the Cu(In,Ga)Se$_2$ compound to form the desired crystal lattice structures.

Although the growth of single crystal CuInSe$_2$ has been studied, such as in the U.S. Pat. No. 4,652,332, issued to T. Ciszek, the use of polycrystalline thin films is really more practical. Sputter depositing a ternary single phase CuInSe$_2$ layer, including the ability to determine the properties of the thin film, such as multi-layer structures, by varying the sputter process parameters, is described by U.S. Pat. No. 4,818,357, issued to Case et al. However, the two fabrication methods of choice are:

(1) Physical vapor deposition of the constituent elements, exemplified by the process disclosed in U.S. Pat. No. 5,141,564, issued to Chen et al., which is generally used as a research tool and (2) The selenization of Cu/In metal precursors by either H$_2$Se gas or Se vapor. The selenization technology generally exemplified by the processes described in U.S. Pat. No. 4,798;660, issued to Ermer et al., U.S. Pat. No. 4,915,745, issued to Pollock et al., and U.S. Pat. No. 5,045,409, issued to Eberspacher et at., is currently favored for manufacturing processes. However, thin-films produced by the selenization processes usually suffer from macroscopic spatial nonuniformities that degrade performace and yield, and reproducible consistent quality from run to run is difficult to obtain and unpredictable. Also, some of the key materials, such as indium and gallium, are very expensive, and current processes are somewhat wasteful of these materials. Therefore, working with Cu(In,Ga)(Se,S)$_2$ material has still been difficult, particularly when scaling up, so it has yet to be commercialized.

SUMMARY OF THE INVENTION

Accordingly, it is a general object of this invention to provide a process that produces a better quality Cu(In,Ga)(Se,S)$_2$ thin-film more consistently and more predictably than previously known processes.

It is also an object of this invention to provide a method of producing high-quality Cu(In,Ga)(Se,S)$_2$ homojunctions more consistently and with more efficient and cost effective utilization of materials.

Another object of the present invention is to provide a process capable of fabricating films of Cu(In,Ga)(Se,S)$_2$ that are smooth and do not require additional processing for photovoltaic characteristics that have applications in solar and non-solar cell functions.

Still another object of this invention is to provide a process for producing high quality Cu(In,Ga)Se$_2$ thin-films that does not require precise control of the ratio of Cu/(In,Ga) during processing, thus can be scaled up easily to production of large areas and to commercial quantities.

Additional objects, advantages, and novel features of the present invention will be set forth in part in the description that follows and in part will become apparent to those skilled in the art upon examination of the following description and drawings or may be learned by the practice of the invention or may be realized and attained by means of the instrumentalities and in combinations particularly pointed out in the appended claims.

To achieve the foregoing and other objects and in accordance with the purpose of the present invention, as embodied and broadly described herein, the method of this invention may comprise the steps of depositing thin-film metal precursors Cu+(In,Ga) in a Cu-rich ratio of Cu/(In,Ga)>1 on a substrate, annealing the precursors at a moderate temperature (about 450° C.) in the presence of a Se overpressure to form thin-film Cu(In,Ga)Se$_2$:Cu$_x$Se phase-separated mixtures adding an (In,Ga) vapor exposure to the thin-film phase-separated mixtures in the Se overpressure while ramping the temperature up from the moderate temperature to a higher recrystallization temperature (about 550° C.), maintaining the thin-film in the Se overpressure at the higher recrystallization temperature for a period of time to allow the Cu$_x$Se and In,Ga+Se to form a slightly Cu-poor thin-film Cu$_x$(In,Ga)$_y$Se$_z$ compound, and then ramping down the temperature of the thin-film while maintaining the Se overpressure

BRIEF DESCRIPTION OF THE DRAWINGS

The accompanying drawings, which are incorporated in and form a part of the specifications, illustrate the preferred embodiments of the present invention, and together with the description serve to explain the principles of the invention.

In the Drawings.

DETAILED DESCRIPTION OF THE PREFERRED EMBODIMENTS

The processes of the present invention comprise steps for fabricating high-quality, thin-film Cu(In,Ga)(Se,S)$_2$—based semiconductor devices that have photovoltaic effects and are especially adaptable for solar cell applications. The process that is the focus of this embodiment of this invention has a number of steps and advantages in common with the process described and claimed in the U.S. patent application Ser. No. 08/045,860, filed on Apr. 12, 1993, which has been allowed and is incorporated herein by reference. Therefore, for clarity, substantial portions of this description include the embodiment in that patent application, referenced hereinafter as "the first process embodiment, and the specific variations and steps of the improved process embodiment according to this invention are called "the second process embodiment."

For purposes of simplicity, the description of the processes and claims of this invention will focus primarily on CuInSe$_2$—based structures. However, it should be understood that Ga or various combinations of In$_{1-x}$Ga$_x$ may be substituted for the In component, and that S or various combinations of Se$_{1-y}$S$_y$ may be substituted for the Se component described in these processes and that such substitutions are considered to be equivalents for purposes of this invention. Also, as mentioned above, where several elements can be combined with or substituted for each other, such as In and Ga, or Se and S, in the component to which this invention is related, it is not uncommon in this art to include in a set of parentheses those elements that can be combined or interchanged, such as CIn,Ga) or (Se,S). The descriptions in this specification sometimes use this convenience. Finally, also for convenience, the elements are discussed with their commonly accepted chemical symbols, including copper (Cu), indium (In), gallium (Ga), selenium (Se), sulphur (S), hydrogen (H), and molybdenum (Mo), and the like.

The first step of a first process embodiment according to principles of this invention is to deposit or grow a high-conductivity, very Cu-rich, phase-separated mixture of monocrystalline or large-grain [CuInSe$_2$]$_\delta$:[Cu$_x$Se]$_{1-\delta}$ ($0 \leq \delta \leq 1$, $1 \leq x \leq 2$), followed by an annealing and recrystallization of the Cu$_x$Se phase. The second step of this first process embodiment includes keeping the temperature high enough to maintain a liquid-rich Cu$_x$Se environment and either depositing In-rich material, such as In and Se, sequential or codepositing the binary In$_y$Se, in a Se gas overpressure environment to form the desired CuIn$_x$Se$_y$ compound, as will be described in more detail below.

Figure 1:
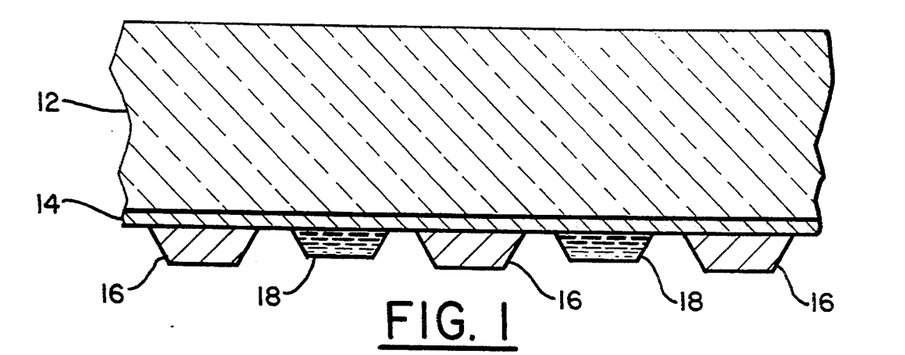
FIG. 1 is a cross-sectional view of a beginning stage of ternary, two-phase polycrystalline growth of CuInSe$_2$:Cu$_x$Se on a conducting substrate in a first step of a preferred embodiment process according to the present invention.

Referring now to FIG. 1, the first step of the first process embodiment, according to this invention, may start by beginning the deposition of the Cu-rich thin-film of CuInSe$_2$:Cu$_x$Se on a substrate 12. The substrate 12 may be, for example, soda-lime silica glass or amorphous 7059 glass. The deposition can be on the bare glass substrate 12, but it may be preferable to include a smooth metallic surface 14, such as a one micrometer (1 $\mu$) layer of molybdenum (Mo).

Figure 2:
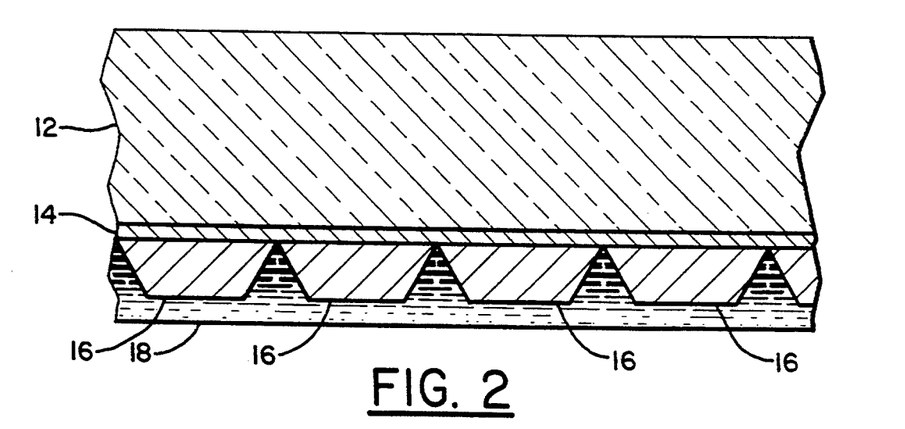
FIG. 2 is a cross-sectional illustration of an intermediate polycrystalline growth stage of the first step of the preferred embodiment process of this invention.
Figure 3:
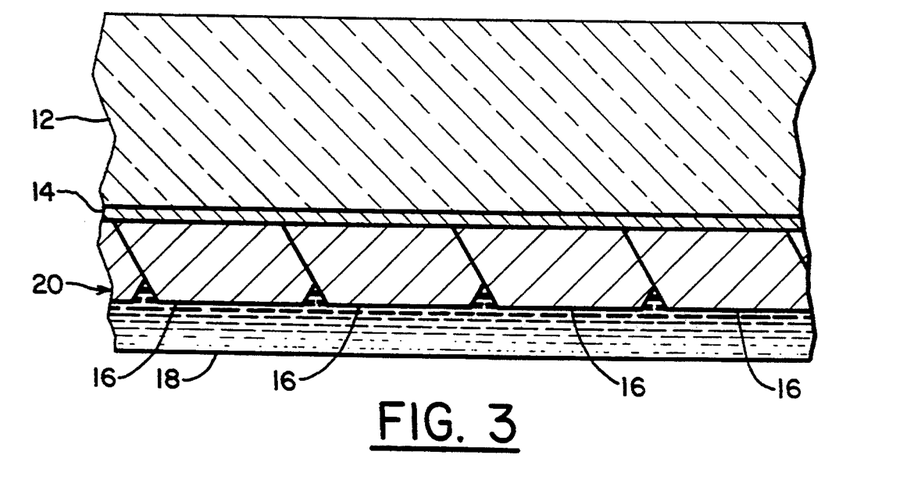
FIG. 3 is a cross-sectional illustration of the final stage of the first step of the preferred embodiment process of this invention.
Figure 7:
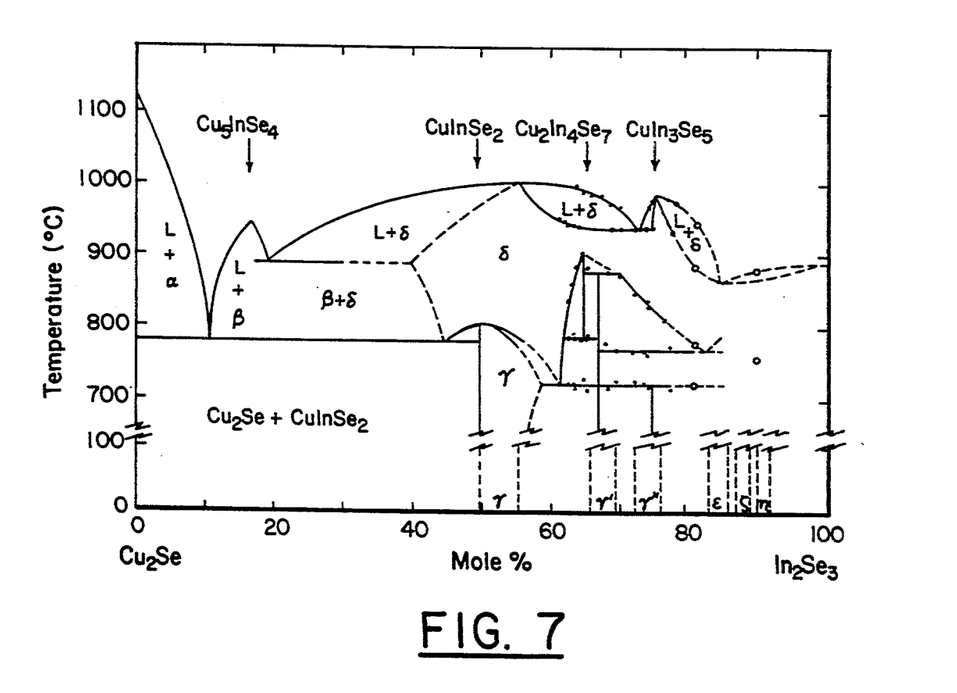
FIG. 7 is a Cu$_2$Se-In$_2$Se$_3$ pseudobinary phase diagram that is useful in describing and understanding the processes of the present invention.

As illustrated in the phase diagram of FIG. 7, when the Cu, In, and Se components are in the Cu-rich range, i.e., where the mole % of In and Se is in the range between 0%–50%, and at temperatures under about 790° C., the CuInSe$_2$ and Cu$_x$Se phases are separated. Therefore, as Cu, In, and Se are deposited in the first process embodiment on the Mo-coated substrate 12 in FIG. 1 in a very Cu-rich mixture, preferably comprising about 40–50 at. % Cu, at a substrate temperature greater than 500° C. (preferably about 500°–550° C.), the CuInSe$_2$ crystalline structures 16 grow separate from the Cu$_x$Se crystalline structures 18, i.e., they are phase-separated. Also, the melting point of the Cu$_x$Se is lower than the melting point of CuInSe$_2$. Therefore, it is preferable for this first process embodiment to maintain the substrate in the above-described temperature range, where the CuInSe$_2$ is a solid, and the Cu$_x$Se is substantially in a liquid flux. Then, as the deposition process continues, as illustrated in FIG. 2, the CuInSe$_2$ phase crystals 16 tend to grow together on the Mo layer 14, displacing the more liquid Cu$_x$Se phase 18 outwardly. The end result of the deposition stage of the first step illustrated in FIG. 3, is a large-grain CuInSe$_2$ phase 16 adhered to the Mo coating 14 with an overlayer of the Cu$_x$Se material 18 on its outer surface. If the CuInSe$_2$ and Cu$_x$Se compounds are deposited sequentially or at lower temperatures for this first process embodiment, this structure is then preferably annealed in a Se atmosphere, such as Se or H$_2$Se vapor, at a temperature of about 500°–550° C. In this annealing stage, any solid Cu$_x$Se 18 is converted to liquid Cu$_x$Se, and a growth-/recrystallization is believed to occur in a liquid flux environment of the Cu$_x$Se binary phase. This growth-/recrystallization process encourages monocrystalline (112), large-grain growth (2–10 μm), which is a superior morphology for device-quality electronic properties. The resulting structure of FIG. 3 is referred to as the large-grain precursor 20, which forms the structural platform for a thin-film electronic device fabricated according to the second step of this first process embodiment described below.

Figure 4:
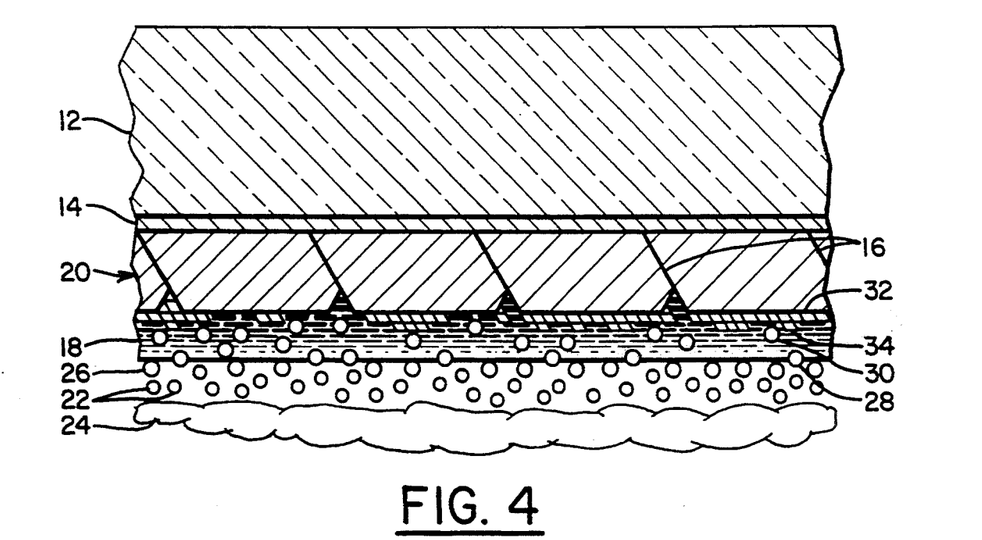
FIG. 4 is a cross-sectional illustration of the beginning of the second step of the preferred embodiment process of this invention.

In the second step of the first process embodiment of this invention, the excess Cu$_x$Se 18 in the large-grain precursor structure 20 is converted to a CuIn$_y$Se$_z$ material by exposure to an activity of In and Se at elevated temperatures for a period of time, as illustrated in FIG. 4. The In and Se exposure can be in the form of In vapor 22 and Se vapor 24, as illustrated in FIG. 4, or it can be In$_y$Se solid, such as the In$_2$Se$_3$ illustrated in FIG. 7, with no Cu content. With the substrate 12 and large-grain precursor structure 20 maintained in the range of about 300°–600° C., the Cu$_x$Se overlayer 18 absorbs and combines with the In 22 to form the desired CuIn$_y$Se$_z$ material. Alternatively, this conversion of Cu$_x$Se to a CuIn$_y$Se$_x$ material can be accomplished by sequential deposition of In and Se on the precursor structure 20. The characteristic of the CuIn$_y$Se$_z$ material can be controlled by maintaining the temperature during this second step of the process, as described below.

Figure 5:
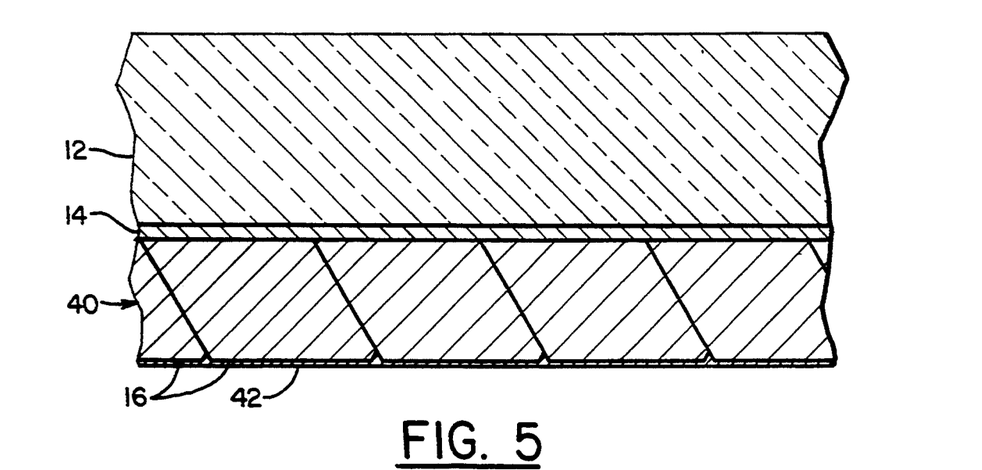
FIG. 5 is a cross-sectional illustration of another optional resulting polycrystalline structure produced according to the present invention that is suitable for heterojunction applications.

A high-temperature treatment option of the second step of this first process embodiment, such as in the range of about 500°–600° C., is illustrated in FIG. 4, and the resulting nearly homogenous film structure 40 is shown in FIG. 5. Essentially, at temperatures in the range of about 500°–600° C., preferably at about 550° C., the Cu$_x$Se overlayer 18 forms a liquid flux, while the CuInSe$_2$ underlayer 16 remains substantially solid. The In vapor 22 condenses to liquid phase 26 at the surface of the Cu$_x$Se overlayer 18. The liquid In 26 and Se gas 24 contacts the overlayer 18, where it combines at the surface with the excess Cu$_x$Se to form additional CuInSe$_2$, as shown at 28. This new CuInSe$_2$ remains in solution while it diffuses, as shown at 30, through the Cu$_x$Se overlayer 18 to the liquid-solid interface 32, where it nucleates and "epitaxial" builds on the original CuInSe$_2$ crystalline structures 16, as shown at 34. The nucleation can be described as:

In(l)+Cu$_x$Se(l)+Se(g)→CuInSe$_2$, where (l) indicates liquid and (g) indicates gas. While it is not known for certain, it is believed that the lesser density of the CuInSe$_2$ in the Cu$_x$Se assists in transferring the CuInSe$_2$ to the liquid-solid interface 38. In any event, this process results in a substantially continuous morphology homogenous film growth of the CuInSe$_2$ crystalline structures 16. When the liquid phase Cu$_x$Se in the overlayer 18 is substantially consumed, the resulting film structure 40 may be near stoichiometric with planar surfaces, as shown in FIG. 5. This recrystallization process in this first process embodiment is self-limiting in that, if the Se to In ratio is lowered, the process rejects In in the form of In$_y$Se when the surface converts from Cu-rich to Cu-poor. It may be slightly Cu-rich or slightly Cu-poor, depending on the extent of Cu$_x$Se recrystallization in this second step. However, the self-limiting nature of the reaction in this first process embodiment makes it unnecessary to regulate the In precisely, thus, this first process embodiment is especially conducive to commercial processing.

The nature of the surface 42 of structure 40 is known to be Cu-poor with a composition equivalent to the CuIn$_3$Se$_5$ phase and is nearly planar and smooth. Proper engineering of this surface 42 can lead to a layer of CuIn$_3$Se$_5$ of sufficient thickness to produce a shallow homojunction, which in turn may not require the thin CdS buffer layer to make an operational solar cell. This film structure 40, which is essentially p-type CuInSe$_2$, can be used on one side of a heterojunction device, as will be obvious to persons having ordinary skill in this art, by overlaying it with a different material, such as a CdS and ZnO window layer (not shown).

Figure 6:
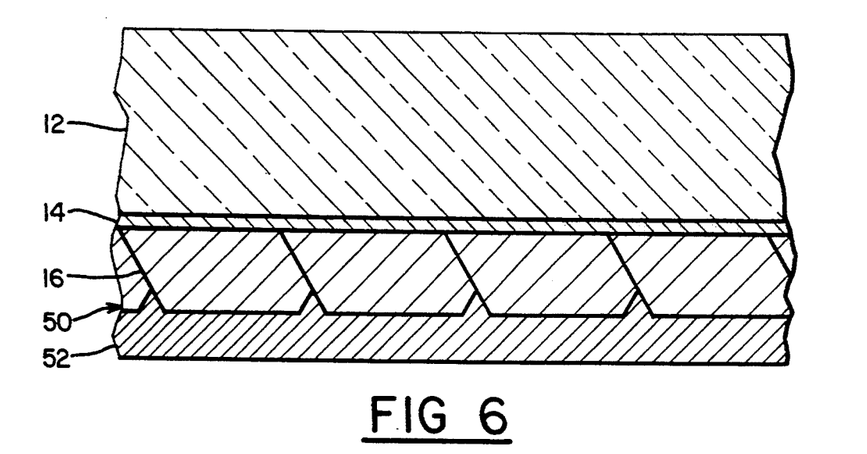
FIG. 6 is a cross-sectional illustration of one optional resulting polycrystalline structure produced according to the present invention that is suitable for homojunction applications.

A lower temperature treatment option in the second step of this first embodiment process according to principles of this invention, such as in the range of about 300°–400° C., can produce a homojunction thin-film device 50, as shown in FIG. 6, that does not require a different material overlay, such as a CdS and ZnO window layer, to have photovoltaic characteristics. In this optional lower temperature range treatment, the conversion of excess Cu$_x$Se to a form of CuIn$_y$Se$_z$ is inhibited from approaching the stoichiometric ratio by the limited mobility of Cu at the lower temperatures, thus resulting in an overlayer 52 of very Cu-poor morphology, such as Cu$_2$In$_4$Se$_7$ in the Y' range or CuIn$_3$Se$_5$ in the Y" range of the phase diagram in FIG. 7. Such Cu-poor structures in the overlayer 52 are n-type materials, in contrast to the p-type Cu-rich CuInSe$_2$ crystalline structures 16 underlaying the n-type layer 52. Therefore, the interface between the underlayer 16 and overlayer 52 forms a homojunction, and the film structure 50 can function as a photovoltaic device.

There are numerous practical options and variations for fabricating thin-film devices according to this invention. Substitution of Ga or a combination of In and Ga for the In and substitution of S or a combination of Se and S for the Se described above, as well as the option of using Se vapor, H$_2$Se vapor, or In$_y$Se$_z$ solids, has already been mentioned. In addition, there are many options for deposition. For example, the deposition can be accomplished by sputtering of the two compounds CuInSe$_2$ and Cu$_x$Se in the first step, either concurrently or sequentially, followed by or concurrently with Se treatment, or by co-evaporation of the constituent elements in an overpressure of Se, or by any combination of methods that will produce a phase-separated mixture of these compounds for the first process embodiment described above.

In other variations, the initial deposition does not have to include both of the compounds Cu(In,Ga)Se$_2$ and Cu$_x$Se for the large-grain precursor mixture. It can start instead with an initial deposition of a binary Cu$_{2-\delta}$Se precursor as an extreme case of the Cu(In,Ga)Se$_2$:Cu$_{2-\delta}$Se large-grain precursor mixture, in which case the In and/or Ga would have to be added in a manner and at a temperature in which phase-separated Cu(In,Ga)Se$_2$:Cu$_x$Se would be produced on the substrate, such as by the addition of a small amount of In$_2$Se$_3$. Of course, the initial deposition of Cu$_{2-8}$Se should be at a lower temperature to get the desired large-grain formation. The formation of the precursor can be dissected further by the conversion of an elemental mixture of Cu, (In,Ga), and (Se,S) to the compound mixture by exposure to Se,S vapor at elevated temperatures, or by the conversion of Cu and (In,Ga) to Cu(In,Ga)Se$_2$ by exposure to H$_2$Se. At the other extreme, an initial deposition of In$_2$Se$_3$ could be made in conjunction with a larger amount of Cu$_2$Se. The goal, regardless of which combination or sequence of materials deposition is used, is to achieve the Cu-rich, phase-separated growth of the Cu(In,Ga)Se$_2$:CuSe mixture in the first step of this first process embodiment, so that the second step can proceed according to that portion of this invention. Also, additional Cu as well as, or instead of, the additional In can be incorporated in the second step.

The second process embodiment of this invention draws on the low temperature deposition option mentioned above, from the higher temperature recrystallization during selenization in an In or Ga activity described above, and from some steps of a standard selenization process steps that we published in our paper, "Fundamental Thermodynamics and Experiments in Fabricating High Efficiency CuInSe$_2$ Solar Cells by Selenization Without the Use of H$_2$Se," D. Albin et al., AIP Conference Proceedings 268, Denver, Colo., 1992, Pg. 108, to improve photovoltaic characteristics of the Cu(In,Ga)(Se,S)$_2$ thin-film, particularly the short circuit current density (J$_{SC}$) response. This second process embodiment starts by depositing only the metal precursors, Cu and In and/or Ga, on the substrate 12 in a slightly Cu-rich proportion. The precursor is annealed and selenized at a moderate temperature of 400°–450° C. to form a Cu-rich CIGS (copper-indium-gallium-selenium) film. This Cu-rich film is then exposed to a flux of In and/or Ga as the temperature is being ramped up to about 550° C., and the resulting mixture is annealed at that temperature to produce a slightly Cu-poor compound. The CIGS film and substrate are then cooled in an overpressure of Se and/or S. The resulting semiconductor films can be used for fabricating solar cells with efficiencies in excess of 12% total-area efficiency.

Figure 8:
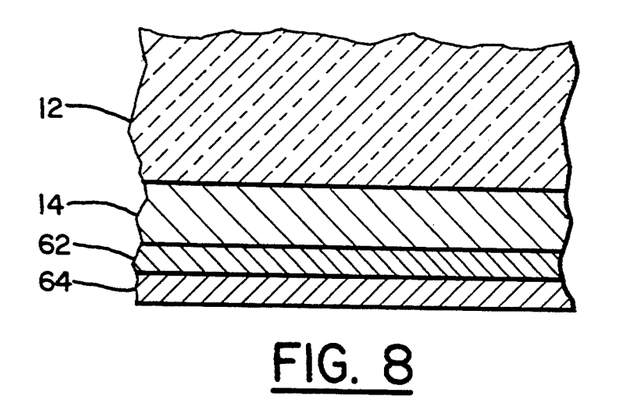
FIG. 8 is a cross-sectional view of a substrate illustrating sequential deposition of the metal precursors on a substrate.
Figure 9:
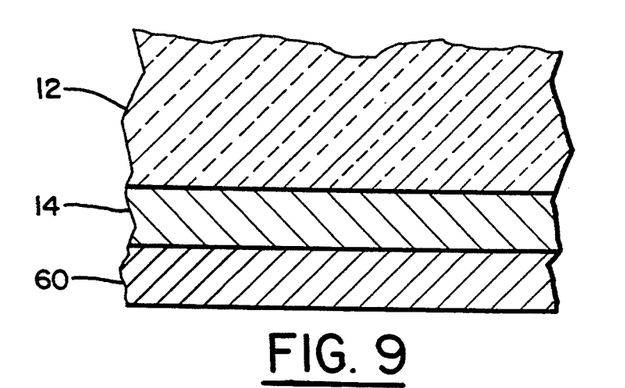
FIG. 9 is a cross-sectional view of a substrate illustrating codeposition of the metal precursors on a substrate.

Referring now to FIGS. 8 and 9 for a more detailed description, the recrystallization approach to CIS or to CIGS thin-film fabrication according to this second process embodiment of this invention begins with depositing the metal precursors, Cu and In and/or Ga, on a substrate 12 or on a Mo layer 14 on a substrate 12, similar to the substrate 12 and Mo layer 14 shown in FIG. 1. These metal precursors, Cu 62 and (In,Ga) 64 can be deposited sequentially, as illustrated in FIG. 8, or co-deposited simultaneously to form a composite layer 60 of Cu and (In,Ga), as indicated in FIG. 9. However, deposition of In+Ga together does not provide satisfactory results, because they can lead to film homogenieties due to formation of In-Ga eutectics. Therefore, it is preferred that the In and Ga deposition steps are separated in time during precursor fabrication.

In either case, the Cu and (In,Ga) should be deposited in amounts such that the atomic proportion of Cu/(In,Ga) is greater than unity, i.e., Cu-rich. It is preferred that this proportion at this first step of the process be in the range of about $1.0 < [\text{Cu}/(\text{In,Ga})] \leq 1.1$.

The deposition process can be e.g., evaporation, co-evaporation, sputtering, electrodepositing, or any other state-of-the-art deposition technique. It can also be done at atmospheric pressure, but no oxygen can be present. Therefore, it is advantageous to perform this deposition of the metal precursors in a vacuum in the range of $10^{-4}$ to $10^{-6}$ torr.

Further, the sequential deposition or co-deposition of Cu and (In,Ga) in the first step described above can be done at low or room temperature, which is advantageous over the hot deposition for the first process embodiment described above, for several reasons. The glass substrate 12 loses its structural rigidity in the 500°–600° C. temperature range and can become somewhat plastic, and it is difficult to heat large sheets of glass uniformly. Therefore, it is difficult to heat large area glass substrates 12 and support them sufficiently to prevent temperature variations and sagging in such large area substrates 12 during prolonged elevated temperatures. Also, while In is a solid at room temperature, it liquifies and vaporizes with consequent substantial loses of In from the system at the elevated temperatures used in the first process embodiment described above. It is about ten times as expensive as Cu, so excessive loss of In is undesirable from a commercial perspective. Ga is a liquid at room temperature, so it is even more vulnerable than In to vaporization and excessive loss during elevated temperature deposition.

Once the metal precursors, Cu and (In,Ga), are deposited on the substrate in Cu-rich proportions, as described in the first step above, the annealing, exposure to an activity of (In,Ga) and Se, and recrystallization parts of the process are performed to make the final CIS or CGIS film slightly Cu-poor, which appears to result in the best CIS or CIGS photovoltaic devices, at least when they are produced according to the process of this invention. To do so according to this invention, the substrate 12 containing the Cu-rich mixture of metal precursors is heated to an annealing temperature in a flux or overpressure of Se and maintained at that annealing temperature to fabricate a Cu-rich, two phase film comprising Cu(In,Ga)Se and Cu$_x$Se similar to the mixture of FIG. 3 for the first process embodiment described above. However, this anneal is preferably done at a moderate temperature in the range of 400°–500° C. (preferably about 450° C.), rather than the high temperature of 500°–600° C. used in the first process embodiment described above, so the Cu$_x$Se phase is not a liquid as was illustrated in FIG. 3.

Prior to this annealing at moderate temperature in a Se overpressure. However, it is desirable to perform a short (5 to 15 minute) low temperature (50°–150° C.) pre-anneal, not in a Se overpressure, to homogenize the Cu and (In,Ga) precursors on the substrate 12. This pre-anneal or homogenization step is not as necessary where sequential deposition of the metal precursor, Cu 62 and (In,Ga) 64, was used. However, it is more beneficial where co-deposition of the metal precursors 60 on the substrate 12 was used, because co-deposited metal precursors 60 seem to be more susceptible to compositional segregation during the subsequent selenization than sequentially deposited metal precursors 62, 64.

After, the pre-anneal or homogenization step, described above, the Se vapor overpressure is started and the temperature of the substrate and homogenized co-deposited precursor 60 or suquentially deposited precursor 62, 64 is ramped up to the moderate temperature anneal of 400°–500° C. (preferably about 450° C.), where it is maintained for fifteen to twenty-five minutes (preferably about twenty minutes). The phase-separated mixture starts to form from the precursors Cu 62 and (In,Ga) 64 during this temperature increase. Because the precursor proportions were deposited Cu-rich, as described above, the resulting phase-separated mixture will include $Cu(In,Ga)Se_2$ and $Cu_xSe$. The Se overpressure during the ramp-up of temperature to the moderate temperature anneal should be enough to bind any free In in a more Se-rich $In_2Se_3$ compound instead of the more Se-poor $In_2Se$, because the more Se-rich $In_2Se_3$ is less volatile than $In_2Se$ and minimizes loss of In from the system. At the same time, the Se overpressure on the Cu-Se compounds tends to make more Se-rich Cu-Se compounds as well, such as CuSe or $CuSe_2$, instead of $Cu_2Se$, and these more Se-rich compounds have lower melting and vaporization temperatures. Therefore, there is a tradeoff in applying the Se overpressure between more Se-rich In-Se compounds that have higher melting and vaporizing temperatures and Se-rich Cu-Se compounds that have lower melting and vaporization temperatures. However, since In is ten times more expensive than Cu, and because Se-rich $In_2Se_3$ is a solid at the moderate 450° C. annealing temperature whereas more Se-poor $In_2Se$ is a gas at that temperature, the balance is tipped in favor of using an overpressure of Se vapor to save In, even though it might cause some Cu loss. However, both $Cu(In,Ga)Se_2$ and $Cu_xIn$ are solids at the moderate 400°–500° C. temperature anneal, Cu loss is minimal, and the selenization that occurs from the Se overpressure during this moderate temperature anneal is essentially depositing Se on solid $Cu(In,Ga)Se_2$ and $Cu_xSe$.

After the moderate temperature anneal and selenization step described above, the Se overpressure is maintained, and the temperature of the $Cu(In,Ga)Se_2:Cu_xSe$ film is ramped up again to the recrystallization temperature range of 500°–600° C. (preferably about 550°), where the $Cu(In,Ga)Se_2$ is solid and the $Cu_xSe$ is liquid, as in the first process embodiment described above. However, during this temperature transition, a flux of (In, Ga) is evaporated along with the Se overpressure onto the $Cu(In,Ga)Se_2:Cu_xSe$ surface. It has been found according to this invention, that better photovoltaic response of the finished film results from adding this In flux only during the ramp-up of temperature from the moderate temperature anneal to the higher recrystallization temperature and preferably terminating before it actually reaches the recrystallization temperature.

The Se overpressure is maintained after the In exposure is stopped and during a short recrystallization or high temperature anneal in the 500°–600° C. range (preferably about 550° C.). This recrystallization or high temperature anneal period is about five to fifteen minutes (preferably about ten minutes) duration, during which recrystallization of the excess $Cu_xSe$ in the previously Cu-rich, two phase $Cu(In,Ga)Se_2:Cu_xSe$ film combines with the additional In and Se from the exposure during the last temperature transition to form additional $Cu(In,Ga)Se_2$. Recrystallization, as used in this context, is the process in which large grain crystalline or polycrystalline structures are grown epitaxially from liquid or small grain compounds. Enough In is added during the temperature transition described above to in effect compensate for the excess Cu in the precursor and results in a slightly Cu-poor film at the end of the recrystallization or high temperature anneal step described above, e.g., $0.93 < [Cu/(In,Ga)] \leq 0.97$. Consequently, a finishing surface effect of Cu-poor $Cu_2In_4Se_7$ or $CuIn_3Se_5$ is left on the film surface. This post-selenization $In_xSe$ reaction can be performed on Cu-rich selenized films with or without air exposure of the Cu-rich film prior to the $In_xSe$ treatment described above.

After the recrystallization or high temperature anneal step, the Se overpressure is maintained to prevent loss of In while the temperature of the film is ramped down to the range of 250°–350° C. (preferably about 300° C.), whereupon the Se overpressure is removed and the temperature continues to ramp down to room temperature. The rate at which the temperature is decreased depends on thermal stresses in the film—the slower the better. It has been found that ramping down film temperature at the rate of about 12.5° C. per minute is satisfactory.

EXAMPLE I

Figure 10:
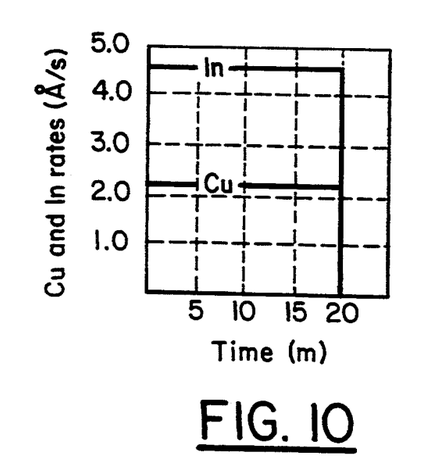
FIG. 10 is a time-flux diagram illustrating codeposition parameters of the metal precursor.
Figure 11:
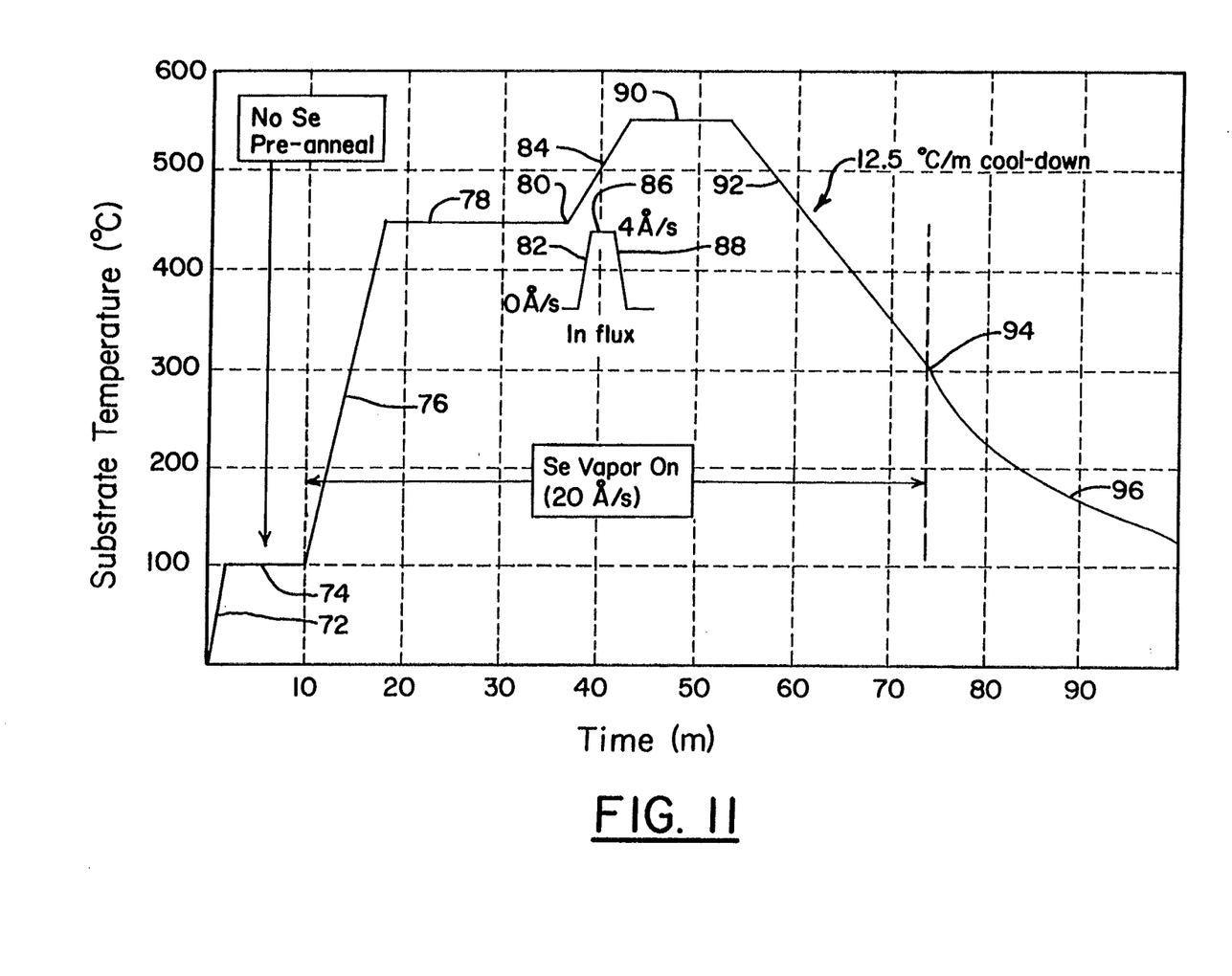
FIG. 11 is a time-temperature diagram illustrating parameters of the selenization anneal and recrystallization steps of forming the slightly Cu-poor CIGS thin-film from a precursor fabricated according to this the recipe shown in FIG. 10.

As shown on FIG. 10, precursors of Cu and In were co-deposited onto a Mo-coated soda-lime silica glass substrate using a Cu flux rate of about 2.2 Å/second and a In flux rate of about 4.7 Å/second for about twenty minutes to make a Cu/In ratio=1.04. This Cu-rich co-deposition of Cu and In precursors was performed by physical vapor deposition (PVD) in a vacuum chamber under a vacuum of $10^{-6}$ torr at room temperature. Then, as shown in FIG. 11, the substrate and precursors were heated up as indicated by line 72, at a rate of about 50° C./minute to the low temperature anneal 74 of about 100° C. to homogenize to precursor mixture. After eight minutes at this low temperature anneal, the Se vapor overpressure was started with a flux rate of 20 Å/second, and the temperature was ramped up again, as shown by line 76, at a rate of about 50° C./minute to the moderate temperature anneal stage 78 of about 450° C. This moderate temperature anneal step 78, still maintaining the selenization flux rate of 20 Å/second, is held at 450° C. for twenty minutes to finish formation of the phase-separated mixture $CuInSe_2:Cu_xSe$. During this moderate temperature anneal step 78, there is not yet any additional exposure to In. However, at about one to two minutes after the end 80 of the moderate temperature anneal step 78, In evaporation is commenced, as indicated at 82, at a flux rate of about 4 Å/second, while also maintaining the Se vapor flux at 20 Å/second. At the same time, the temperature is ramped up again as shown at 84 at a rate of about 16.7° C./minute to reach the recrystallization or high anneal temperature of 550° C. in six minutes. However, the In vapor deposition is stopped as shown at 88 approximately one to two minutes before reaching the high temperature anneal 90 such that a total In thickness of about 500 Å is used during this step. The recrystallization or high temperature anneal step 90 is maintained at 550° C. for ten minutes while also continuing to maintain the Se vapor overpressure at 20 Å/second flux rate to complete the fabrication of the slightly Cu-poor CIS with a Cu/In ratio of less than 1.0, preferably about 0.93–0.97 where 500 Å of In is used, as in this example, the ratio of Cu/In=0.95. The film is then cooled as shown at 92 at a rate of 12.5° C./minute while maintaining the 20 Å/second flux rate of Se overpressure down to 300° C., whereupon the Se overpressure is turned off at 94 and the finished film is cooled as shown at 96 to room temperature.

Figure 12A:
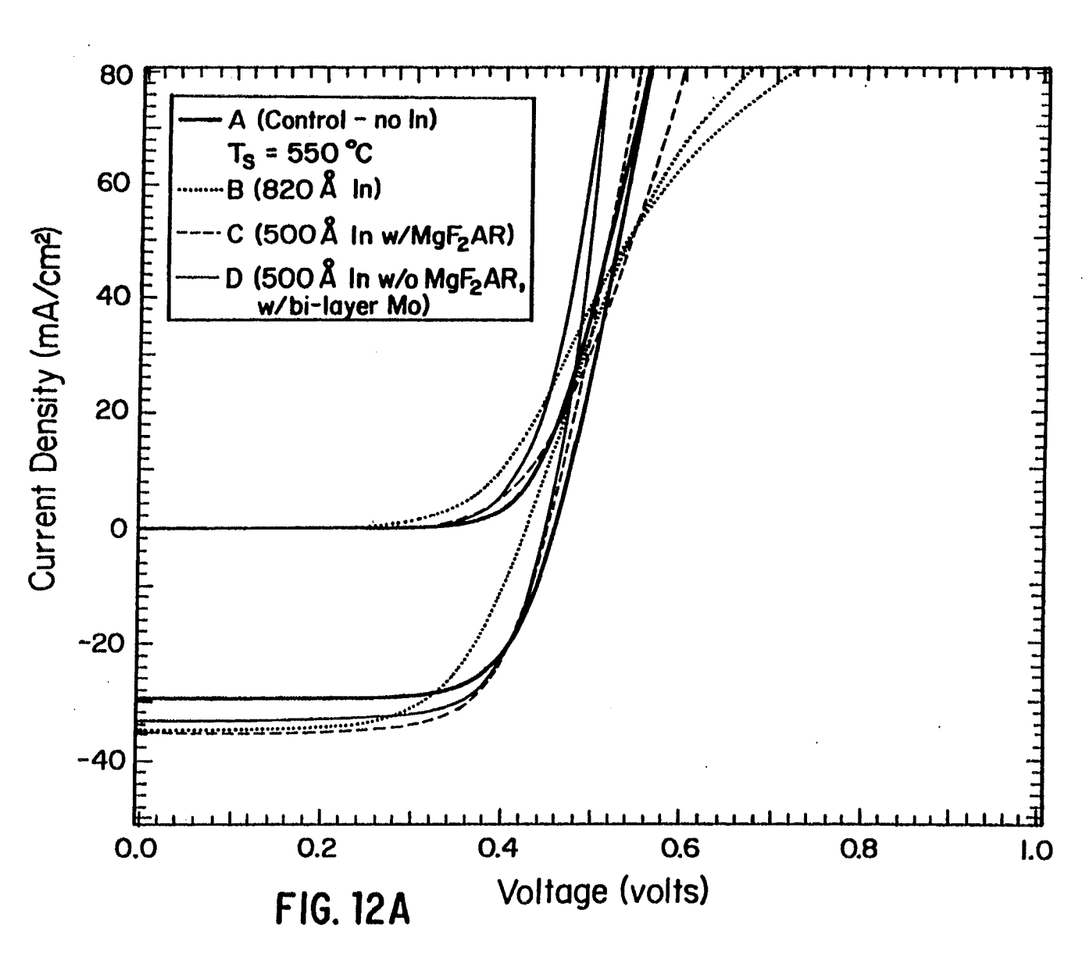
FIG. 12 is a I-V photovoltaic response diagram of devices made with several In deposition thicknesses for recrystallization according to this invention and compared with a control device made without in for recrystallization.
Figure 12B:
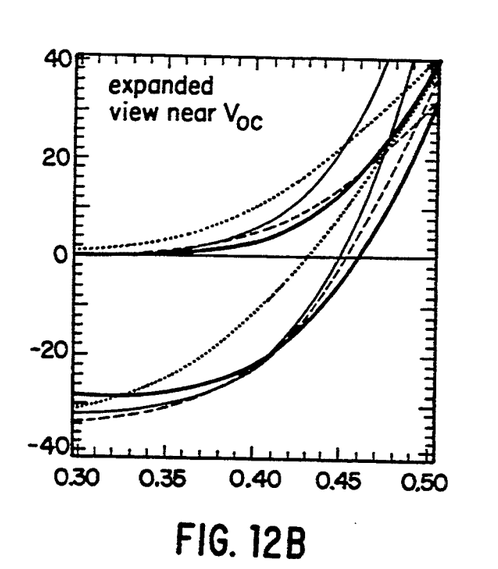
Figure 13:
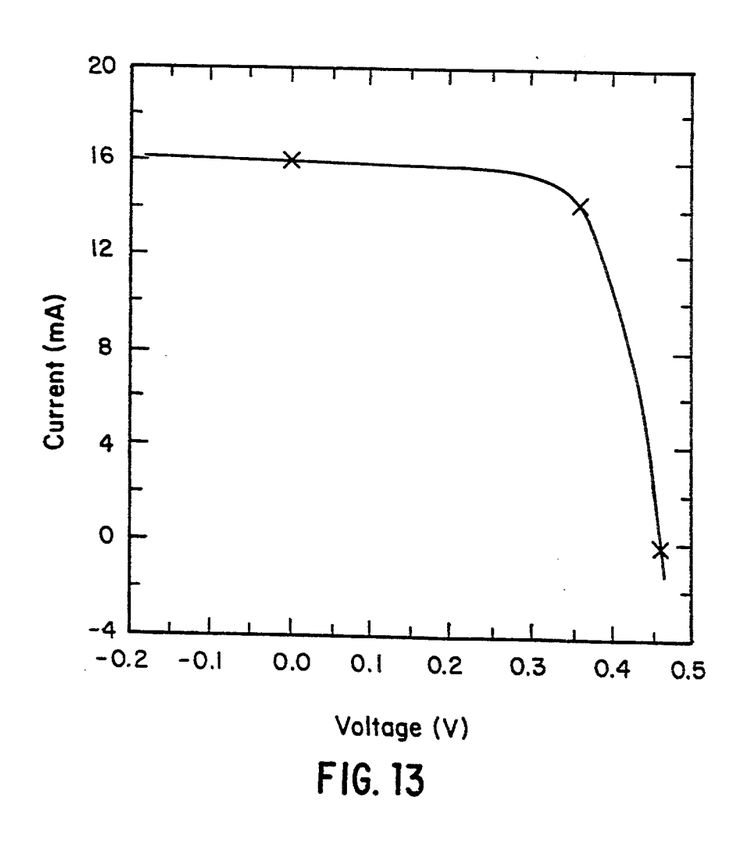
FIG. 13 is an official measurement of a 11.2% non-Ga containing CuInSe$_2$ device made by this invention.
Figure 14:
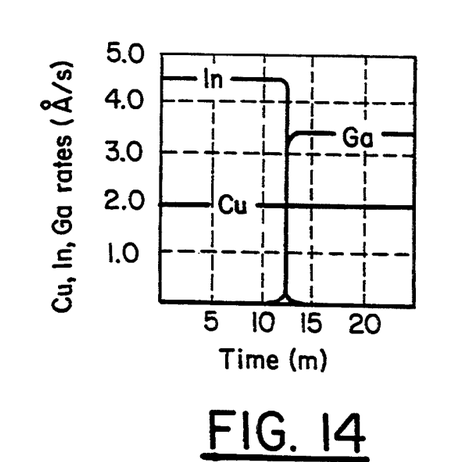
FIG. 14 is a time-flux diagram similar to FIG. 10, but illustrating parameters for one method of including Ga as a precursor.

The film sample C shown in FIG. 12, characteristic of the before-mentioned 500 Å In-treatment (with MgF$_2$ antireflective (AR) coating is compared with three other samples (A, B, and D) in which no In, 820 Å of In, and 500 Å of In in conjunction with an improved Mo-back contact were used, respectively. The Mo-back contact comprised of two distinct Mo layers (i.e., bi-layer Mo in a thin porous layer which adheres strongly to the glass followed by a thicker, denser layer which has much lower sheet resistance. The composite Mo layer exhibits high adhesion and low sheet resistance. Top surface preparation was with a cadmium sulfide/zinc oxide (CdS/ZnO) window and an aluminum (Al) grid. The IV curves for these samples in FIG. 12 show that systematic variation in fillfactor (FF), open-circuit voltage ($V_{oc}$), and short circuit current density ($J_{ac}$) were observed with increasing amounts of In. As seen in FIG. 12, the $V_{oc}$ decreases slightly with increasing In used during the recrystallization step 86 (FIG. 11), but $J_{ac}$ increases substantially. FIG. 12 also shows that when large amounts of In were used, 1st-quadrant roll-over is more pronounced, but it could be avoided with lesser amounts of In. An official measurement of the device I-V curve data for a 517 Å-In treatment is shown in FIG. 13, where an efficiency of 11.2% was confirmed.

The foregoing description is considered as illustrative only of the principles of the invention. Further, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed are defined as follows:

1. A process for fabricating thin-film semiconductor devices, comprising the steps of:
   depositing thin-film precursors of Cu and (In,Ga) on a substrate in a Cu-rich ratio with Cu/(In,Ga)>1.0;
   annealing the thin-film precursors in the presence of Se at a moderate temperature in the range of 400°-500° C. to form thin-film Cu(In,Ga)Se$_2$:Cu$_x$Se phase-separated mixture;
   exposing the thin-film Cu(In,Ga)Se$_2$:Cu$_x$Se phase-separated mixture to (In,Ga) vapor in addition to Se to deposit (In,Ga) and Se on the thin-film Cu(In,Ga)Se$_2$:Cu$_x$Se phase-separated mixture while raising the temperature of the thin-film Cu(In,Ga)Se$_2$:Cu$_x$Se phase-separated mixture from the moderate temperature to a higher recrystallization temperature to a higher recrystallization temperature in the range of 500°-600° C.;
   maintaining the thin-film at the higher recrystallization temperature to recrystallize the Cu$_x$Se with the (In,Ga) and Se to form a Cu(In,Ga)Se$_2$ thin-film in a Cu-poor ratio of Cu/(In,Ga)<1.0.

2. The process of claim 1, including the step of maintaining the presence of Se while cooling the Cu(In,Ga)Se$_2$ thin-film to a temperature below the higher recrystallization temperature.

3. The process of claim 2, wherein said cooling occurs at a rate of about 12.5° C./minute.

4. The process of claim 2, wherein the temperature below the higher recrystallization temperature is in the range of 250°-350° C.

5. The process of claim 4, including the step of removing the Se presence when the temperature of the Cu(In,Ga)Se$_2$ thin-film drops to said temperature below the higher recrystallization temperature.

6. The process of claim 4, wherein said temperature below the higher recrystallization temperature is about 300° C.

7. The process of claim 1, wherein said moderate temperature is about 450° C.

8. The process of claim 1, wherein said higher recrystallization temperature is about 550° C.

9. The process of claim 1, including the step of providing said Se in a vapor overpressure.

10. The process of claim 1, wherein the step of providing said Se in a vapor overpressure is at a flux rate of about 20 Å/second.

11. The method of claim 1, wherein said step of exposing the thin-film Cu(In,Ga)Se$_2$:Cu$_x$Se phase-separated mixture to (In,Ga) vapor includes In with no Ga.

12. The method of claim 1, wherein said step of exposing the thin-film Cu(In,Ga)Se$_2$:Cu$_x$Se phase-separated mixture to (In,Ga) vapor includes providing the (In,Ga) in a vapor at a flux ram of about 4 Å/second.

13. The method of claim 1, wherein said step of exposing the thin-film Cu(In,Ga)Se$_2$:Cu$_x$Se phase-separated mixture to (In,Ga) includes raising the temperature of the thin-film Cu(In,Ga)Se$_2$:Cu$_x$Se phase-separated mixture from the moderate temperature to the higher recrystallization temperature over a period of time and exposing the thin-film Cu(In,Ga)Se$_2$:Cu$_x$Se phase-separated mixture to the (In,Ga) for a portion less than said period of time.

14. The method of claim 13, wherein said period of time is in the range of three to nine minutes.

15. The method of claim 13, wherein said period of time is about six minutes.

16. The method of claim 15, wherein said step of exposing said thin-film Cu(In,Ga)Se$_2$:Cu$_x$Se phase-separated mixture to (In,Ga) occurs during the first two minutes of said six-minute time period.

17. The method of claim 1, wherein said step of maintaining the thin-film at the higher recrystallization temperature extends for a time period in the range of five to fifteen minutes.

18. The method of claim 1, wherein said step of maintaining the thin-film at the higher recrystallization temperature extends for a time period of about ten minutes.

19. The method of claim 1, wherein said step of annealing the thin-film precursors in the presence of Se occurs over a time period in the range of about ten to thirty minutes.

20. The method of claim 1, wherein said step of annealing the thin-film precursors in the presence of Se occurs over a time period of about twenty minutes.

21. The method of claim 1, including the step of depositing the thin-film precursors of Cu and (In,Ga) on the substrate at room temperature.

22. The method of claim 21, including the step of annealing the thin-film precursors at a low temperature for a period of time before said step of annealing the thin-film precursors in the presence of Se at a moderate temperature.

23. The method of claim 22, wherein said low temperature is in the range of 50°-150° C.

24. The method of claim 22, wherein said low temperature is about 100° C.

25. The method of claim 22, wherein said time period is in the range of five to eleven minutes.

26. The method of claim 22, wherein said time period is about eight minutes.

* * * * *